United States Patent
Choi et al.

(10) Patent No.: US 8,344,439 B2
(45) Date of Patent: *Jan. 1, 2013

(54) INTEGRATED CIRCUIT CAPACITORS HAVING COMPOSITE DIELECTRIC LAYERS THEREIN CONTAINING CRYSTALLIZATION INHIBITING REGIONS AND METHODS OF FORMING SAME

(75) Inventors: Jae-hyoung Choi, Gyeonggi-do (KR); Jung-hee Chung, Seoul (KR); Cha-young Yoo, Gyeonggi-do (KR); Young-sun Kim, Gyoenggi-do (KR); Se-hoon Oh, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/171,163

(22) Filed: Jun. 28, 2011

(65) Prior Publication Data

US 2011/0278698 A1 Nov. 17, 2011

Related U.S. Application Data

(63) Continuation of application No. 12/754,713, filed on Apr. 6, 2010, now Pat. No. 7,973,352, which is a continuation of application No. 11/210,332, filed on Aug. 24, 2005, now Pat. No. 7,723,770.

(30) Foreign Application Priority Data

Aug. 26, 2004 (KR) ................ 2004-67433

(51) Int. Cl.
 *H01L 29/94* (2006.01)
(52) U.S. Cl. ... 257/310; 257/306; 257/296; 257/E21.01; 438/240
(58) Field of Classification Search .......... 257/310, 257/406, 306, 296, E21.21
See application file for complete search history.

(56) References Cited

U.S. PATENT DOCUMENTS

| 6,700,771 B2 | 3/2004 | Bhattacharyya |
| 7,002,788 B2 | 2/2006 | Jeong et al. |

(Continued)

FOREIGN PATENT DOCUMENTS

KR 1020020063525 A 8/2002

(Continued)

OTHER PUBLICATIONS

Dragoo et al., "Transitions in Vapor-Deposited Alumina from 300° to 1200° C.," Journal of the American Ceramic Society, vol. 50, No. 11 Nov. 1967, pp. 568-574.

(Continued)

*Primary Examiner* — Jerome Jackson, Jr.
*Assistant Examiner* — Jose R Diaz
(74) *Attorney, Agent, or Firm* — Myers Bigel Sibley & Sajovec, P.A.

(57) ABSTRACT

Integrated circuit capacitors have composite dielectric layers therein. These composite dielectric layers include crystallization inhibiting regions that operate to increase the overall crystallization temperature of the composite dielectric layer. An integrated circuit capacitor includes first and second capacitor electrodes and a capacitor dielectric layer extending between the first and second capacitor electrodes. The capacitor dielectric layer includes a composite of a first dielectric layer extending adjacent the first capacitor electrode, a second dielectric layer extending adjacent the second capacitor electrode and an electrically insulating crystallization inhibiting layer extending between the first and second dielectric layers. The electrically insulating crystallization inhibiting layer is formed of a material having a higher crystallization temperature characteristic relative to the first and second dielectric layers.

15 Claims, 15 Drawing Sheets

U.S. PATENT DOCUMENTS

| | | |
|---|---|---|
| 7,038,284 B2 | 5/2006 | Haukka et al. |
| 7,723,770 B2 | 5/2010 | Choi et al. |
| 7,973,352 B2 * | 7/2011 | Choi et al. .................. 257/310 |
| 2002/0130340 A1 | 9/2002 | Ma et al. |
| 2002/0190302 A1* | 12/2002 | Bojarczuk et al. ............ 257/310 |
| 2004/0061157 A1 | 4/2004 | Kiyotoshi et al. |
| 2004/0104420 A1 | 6/2004 | Coolbaugh et al. |
| 2004/0141390 A1 | 7/2004 | Won et al. |
| 2004/0206999 A1 | 10/2004 | Hyde et al. |
| 2005/0082595 A1 | 4/2005 | Lee et al. |
| 2005/0087790 A1 | 4/2005 | Dornisch et al. |
| 2005/0152094 A1* | 7/2005 | Jeong et al. .................. 361/312 |
| 2006/0022245 A1 | 2/2006 | Jeong et al. |
| 2009/0181530 A1 | 7/2009 | Lisiansky et al. |

FOREIGN PATENT DOCUMENTS

| | | |
|---|---|---|
| KR | 102004001486 A | 1/2004 |
| KR | 1020070014475 A | 2/2007 |
| KR | 1020070024939 A | 3/2007 |
| KR | 100771540 B1 | 10/2007 |
| KR | 100818657 B1 | 3/2008 |

OTHER PUBLICATIONS

Kim et al., "Effects of crystallization on the electrical properties of ultrathin HfO2 dielectrics grown by atomic layer deposition," Applied Physics Letters, vol. 82, No. 1, Jan. 6, 2003, pp. 106-108.

Scarel et al., "Effects of grown temperature on the properties of atomic layer deposition grown $ZrO_2$ films," J. Vac. Sci. Technol A 21(4), Jul./Aug. 2003, pp. 1359-1365.

* cited by examiner

US 8,344,439 B2

INTEGRATED CIRCUIT CAPACITORS HAVING COMPOSITE DIELECTRIC LAYERS THEREIN CONTAINING CRYSTALLIZATION INHIBITING REGIONS AND METHODS OF FORMING SAME

REFERENCE TO RELATED APPLICATIONS

This application is a continuation of U.S. patent application Ser. No. 12/754,713, filed Apr. 6, 2010, now U.S. Pat. No. 7,973,352, which is a continuation of U.S. patent application Ser. No. 11/210,332, now U.S. Pat. No. 7,723,770, which application claims priority to Korean Patent Application No. 2004-67433, filed Aug. 26, 2004, the disclosures of which are hereby incorporated herein by reference.

FIELD OF THE INVENTION

The present invention relates to integrated circuit devices and methods of forming integrated circuit devices and, more particularly, to integrated circuit capacitors and methods of forming integrated circuit capacitors.

BACKGROUND OF THE INVENTION

As the degree of integration of semiconductor devices increases, the area occupied by each semiconductor device on a chip also decreases. Accordingly, capacitors, which store information in a dynamic random access memory (DRAM), must be made smaller while still retaining at least the same storage capacity.

There are many studies in progress for increasing the capacity of capacitors, and recently, a technique of using a dielectric film having a high dielectric constant has become one main technique. Dielectric films having a high dielectric constant are frequently metal oxides obtained from a metal having a high oxygen affinity. Such a dielectric film may have a large leakage current since the dielectric constant is not stable. A metal having a high work function may be necessary for the capacitor electrode when using a dielectric film having an unstable high dielectric constant. A capacitor having the above mentioned structure is generally called a metal-insulator-metal (MIM) capacitor.

A tantalum oxide film ($Ta_2O_5$) is often used as a dielectric film of a conventional MIM capacitor. The tantalum oxide film has a dielectric constant of about 25. The tantalum oxide film may generate a large leakage current even though its dielectric constant is high. Accordingly, when using the tantalum oxide film as a dielectric film, ruthenium (Ru) metal is frequently used as the electrode of the capacitor since ruthenium has superior barrier characteristics compared to other metals. However, ruthenium is very expensive, making it less than ideal for mass-production.

A titanium nitride film (TiN) can also be used as an electrode material of a capacitor, since it is less expensive than ruthenium and is often used in semiconductor manufacture. The titanium nitride film has low reactivity, stable leakage current characteristics and superior conductivity. However, since the titanium nitride film has lower barrier characteristics than the ruthenium metal layer, the tantalum oxide film cannot be used as a dielectric film when the titanium nitride film is used as an electrode, due to its large leakage current.

Accordingly, a hafnium oxide ($HfO_2$) film, which has better leakage current characteristics than the tantalum oxide film, is often used as a dielectric film when titanium nitride electrodes are used. The hafnium oxide film has an almost identical dielectric constant of about 20 to 25 and higher reliability than the tantalum oxide film. A capacitor having the structure of titanium nitride film/hafnium oxide film/titanium nitride film is cheaper, generates lower leakage current, and provides higher capacitance than a capacitor having the structure of ruthenium/tantalum oxide film/ruthenium. Therefore, the titanium nitride/hafnium oxide/titanium nitride capacitor is more suitable for a DRAM device with a design rule of less than 100 nm. A technique of using such a hafnium oxide film is disclosed in U.S. Pat. No. 6,348,368B1 and U.S. Pat. No. 6,420,279.

However, the structure of a titanium nitride/hafnium oxide/titanium nitride capacitor has some drawbacks. This type of capacitor generates lower leakage current when it is manufactured. After manufacture, however, the capacitor may generate a large leakage current while performing a back-end process of a semiconductor device for forming an interlayer insulating layer (not shown), a barrier metal layer (not shown) and a metal interlayer insulating layer (not shown), especially during a deposition process of a barrier metal layer at a high temperature. By the tight thermal process, the hafnium oxide film is crystallized and then a leakage current is generated in the hafnium oxide film. That is, if the hafnium oxide dielectric film is crystallized during the high thermal process, leakage current is increased by crystal defects generated in the hafnium oxide film.

FIG. 1 is a graph showing a crystal peak of a hafnium oxide dielectric film of a capacitor. In the graph, a curve (a) shows a crystal peak of a hafnium oxide film as deposited, and curves (b), (c) and (d) show crystal peaks of the hafnium oxide film after the back-end process. In more detail, curve (b) shows a crystal peak of the hafnium oxide film processed at 500° C., curve (c) shows a crystal peak of the hafnium oxide film processed at 537° C., and curve (d) shows a crystal peak of the hafnium oxide film processed at 550° C. As shown in the graph, there is no peak beside a crystal peak of a lower electrode made of a titanium nitride film right after forming the capacitor, when using a hafnium oxide film as a dielectric film of a capacitor. However, the dielectric film shows crystal peaks after performing the back-end process. Therefore, crystal defects may be generated in the dielectric film. Also, the hafnium oxide film must be formed 10 nm thick for a DRAM device of less than 100 nm design rule. The hafnium oxide film may be deposited to a uniformed thickness on a flat plane. However, it is very difficult to form the hafnium oxide film to a uniform thickness on the three-dimensional surface of a lower electrode. Therefore, additional leakage current is generated.

SUMMARY

Embodiments of the present invention include integrated circuit capacitors having composite dielectric layers therein. These composite dielectric layers include crystallization inhibiting regions that operate to increase the overall crystallization temperature of the composite dielectric layer. In some of these embodiments, an integrated circuit capacitor includes first and second capacitor electrodes and a capacitor dielectric layer extending between the first and second capacitor electrodes. The capacitor dielectric layer includes a composite of a first dielectric layer extending adjacent the first capacitor electrode, a second dielectric layer extending adjacent the second capacitor electrode and an electrically insulating crystallization inhibiting layer extending between the first and second dielectric layers. The electrically insulating crystallization inhibiting layer is formed of a material having a higher crystallization temperature characteristic relative to the first and second dielectric layers. The first and second capacitor electrodes may include a material selected from a group consisting of titanium nitride, tantalum nitride and tungsten nitride. The first and second dielectric layers may include a material selected from a group consisting of hafnium oxide, zirconium oxide and lanthanum oxide. The electrically insulating crystallization inhibiting layer is also formed to be thinner than the first and second dielectric layers. This electrically insulating crystallization inhibiting layer may include a material selected from a group consisting of hafnium oxide, zirconium oxide, lanthanum oxide, aluminum oxide, aluminum nitride and silicon nitride.

According to additional embodiments of the invention, a MIM (metal-insulator-metal) capacitor includes a lower electrode made of metal, a dielectric film formed on the lower electrode, a top electrode of metal, formed on the dielectric film, and a crystallization prevention layer formed in the dielectric film, wherein the crystallization prevention layer is made of a different material from the dielectric film.

According to another embodiment of the present invention, there is provided a MIM (metal-insulator-metal) capacitor including a lower electrode made of a metal nitride layer and having the shape of a cylinder, a first dielectric film formed on the lower electrode, a crystallization prevention layer formed on the first dielectric film and made of a different material from the first dielectric film, a second dielectric film formed on the crystallization prevention layer, a top electrode formed on the second dielectric film, and a capping layer formed on the surface of the top electrode, wherein the first dielectric film is thicker than the second dielectric film.

At least one of the first dielectric film and the second dielectric film may include nitrogen, and each of the first dielectric film and the second dielectric film may have a thickness of 1 to 10 nm. The crystallization prevention layer may have a thickness of 0.1 to 2 nm. The first dielectric film and the second dielectric film may be a hafnium oxide layer, and the crystallization prevention layer is an aluminum oxide layer. The capping layer may be a polysilicon layer, a silicon germanium layer or a tungsten layer.

According to another embodiment of the present invention, there is provided a method of manufacturing a MIM (metal-insulator-metal) capacitor including forming a lower electrode using a metal nitride layer, forming a first dielectric film on the lower electrode, forming a crystallization prevention layer on the first dielectric film using a different material from the first dielectric film, forming a second dielectric film on the crystallization prevention layer, and forming a top electrode on the second dielectric film using a metal nitride layer.

According to still another embodiment of the present invention, there is provided a method of manufacturing a MIM (metal-insulator-metal) capacitor including forming a lower electrode using a metal nitride layer, forming a first dielectric film on the lower electrode by ALD (atomic layer deposition), forming a crystallization prevention layer on the first dielectric film using a different material from the first dielectric film by ALD (atomic layer deposition), forming a second dielectric film on the crystallization prevention layer by ALD (atomic layer deposition) and forming a top electrode on the second dielectric film using a metal nitride layer, wherein in forming the first dielectric film, in forming the crystallization layer, and in forming the second dielectric film, a pumping process is additionally performed before and/or after forming the first dielectric film, forming the crystallization layer and forming the second dielectric film.

DETAILED DESCRIPTION OF THE INVENTION

Figure 1:
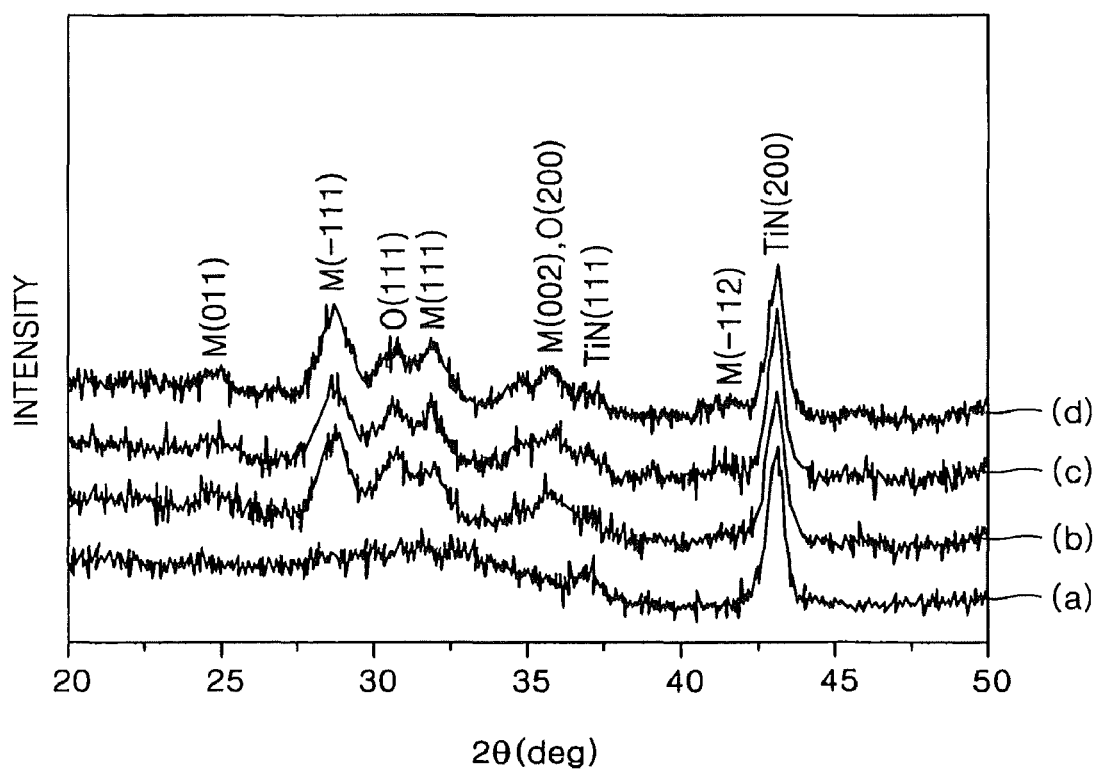
FIG. 1 is a graph shows a crystal peak of a dielectric film of a conventional capacitor.

The attached drawings for illustrating preferred embodiments of the present invention are referred to in order to gain a sufficient understanding of the present invention, the merits thereof, and the objectives accomplished by the implementation of the present invention. Hereinafter, the present invention will be described in detail by explaining preferred embodiments of the invention with reference to the attached drawings. Like reference numerals in the drawings denote like elements.

Figure 2A:
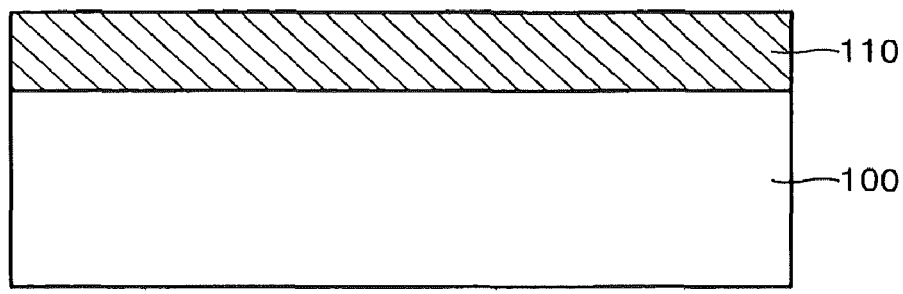
FIGS. 2A through 2C are cross sectional views of a capacitor according to an embodiment of the present invention.
Figure 2B:
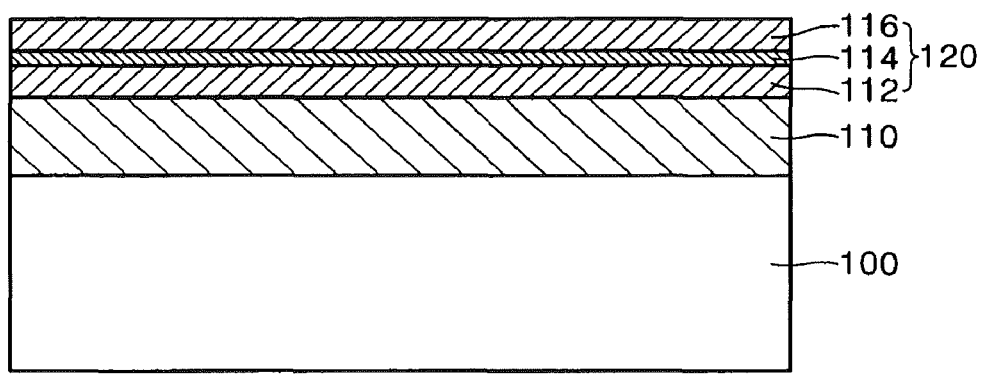
Figure 2C:
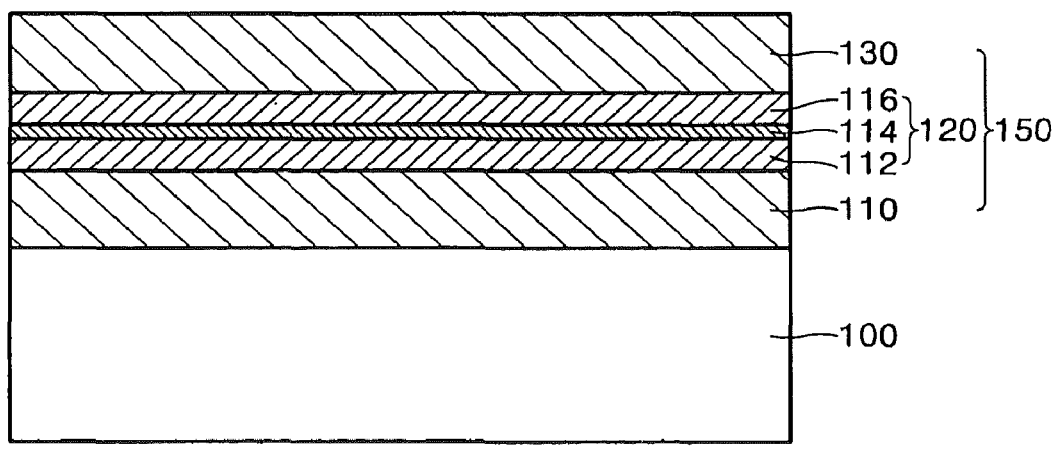

FIGS. 2A through 2C are cross sectional views of a capacitor according to an embodiment of the present invention. Referring to FIG. 2A, a conductive layer 110 for a lower electrode is formed on the upper surface of a semiconductor substrate 100. The conductive layer 110 may be a metal nitride layer such as a titanium nitride film (TiN), a tungsten nitride film (WN) or a tantalum nitride film (TaN). The conductive layer 110 may be formed by chemical vapor deposition (CVD), atomic layer deposition (ALD) or sequential flow deposition (SFD). As shown in FIG. 2B, a capacitor dielectric film 120 is formed on the conductive layer 110. In the present embodiment, the capacitor dielectric film 120 includes a first dielectric film 112, a second dielectric film 116, and a crystallization prevention layer 114 interposed between the first and second dielectric films 112 and 116. This layer 114 is also referred to herein as a crystallization-inhibiting layer. The first and second dielectric films 112 and 116 may be formed of hafnium oxide (HfO2), zirconium oxide (ZrO2) or lanthanum oxide (La2O5), which have high dielectric constants and generate less leakage current at a junction with a metal nitride layer. The first and second dielectric films 112 and 116 may be made of the same material. Furthermore, at least one of the first and second dielectric films 112 and 116 may include nitrogen. It is preferable that the first and second dielectric films 112 and 116 are the same thickness, or the first dielectric film 112 adjacent to the conductive layer 110 is thicker than the second dielectric film 116.

The crystallization prevention layer 114 is a layer, which operates to raise the crystallization temperature of the first and second dielectric films 112 and 116. The crystallization prevention layer 114 may be formed of a different material(s) from the first and second dielectric films 112 and 116. It is preferable that the crystallization prevention layer 114 is a dielectric film having a higher crystallization temperature than the first and second dielectric films 112 and 116. It is also preferable that the crystallization prevention layer 114 is a dielectric film that is thinner than the first and second dielectric films 112 and 116. It is well known that the crystallization temperature of a dielectric film lowered as the dielectric film is made thinner. That is, a dielectric film is more easily crystallized when it is thin. Nonetheless, if the crystallization prevention layer 114 has a sufficiently higher crystallization temperature than the first and second dielectric films 112 and 116, the crystallization temperature of the whole dielectric film increases. Finally, if the crystallization prevention layer 114 is thinner than the dielectric films 112 and 116, it can prevent the increase of the dielectric constant of the dielectric film.

Such a crystallization prevention layer 114 may be made of aluminum oxide Al2O5, aluminum nitride AlN or silicon nitride (Si3N4), which have higher crystallization temperatures than the dielectric films 112 and 116. Also, the crystallization prevention layer 114 may be formed of hafnium oxide (HfO2), zirconium oxide (ZrO2), lanthanum oxide (La2O5) or tantalum oxide (Ta2O5), which have superior dielectric constant characteristics.

It is preferable that the capacitor dielectric film 120 has a thickness of 5 to 12 nm to give an equivalent oxide layer of 25 Å, when used in a DRAM device with a design rule of less than 100 nm. For example, the first and second dielectric films 112 and 116 may be formed to 10 nm thick and the crystallization prevention layer 114 may be formed to 0.1 to 2 nm thick. It is preferable that atomic layer deposition (ALD) is used to form the first dielectric film 112, the crystallization prevention layer 114 and the second dielectric film 116 with these thin thickness values.

Referring to FIG. 2C, a top conductive layer 130 is formed on the capacitor dielectric film 120. The top conductive layer 130 is a conductive layer for a top electrode. The top conductive layer 120 may be formed of a metal nitride layer identical to the bottom conductive layer 110. Forming the top conductive layer 130 completes the capacitor 150.

According to the present embodiment, the crystallization temperature of the dielectric films 112 and 116 is raised by interposing the crystallization prevention layer 114 between the first dielectric film 112 and the second dielectric film 116. Therefore, crystallization of the dielectric film 120 during back-end processing can be inhibited.

Figure 3A:
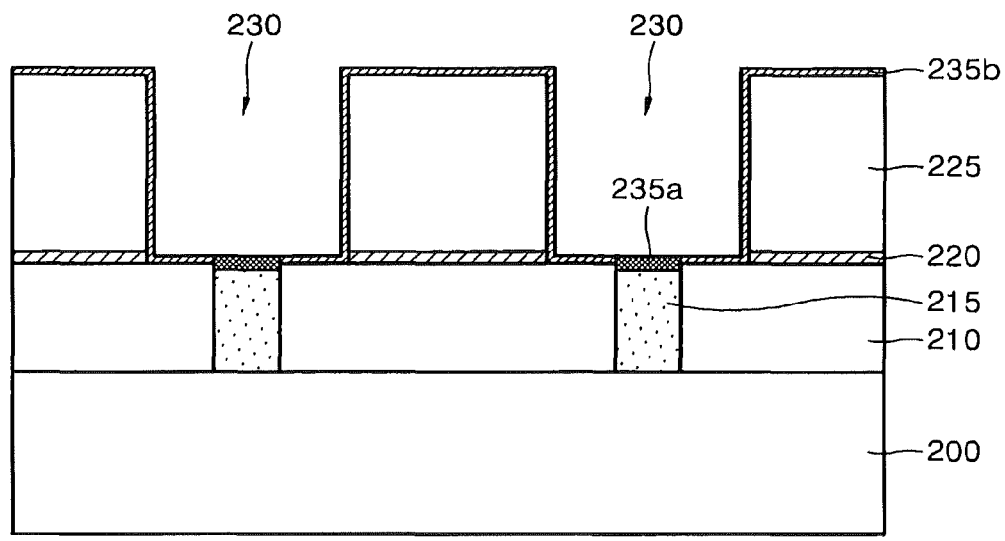
FIGS. 3A through 3F are cross sectional views for explaining a method of manufacturing a semiconductor device according to another embodiment of the present invention.

FIGS. 3A through 3F are cross sectional views for explaining a method of manufacturing a semiconductor device according to another embodiment of the present invention. Referring to FIG. 3A, an interlayer insulating layer 210 is formed on a semiconductor substrate 200. A conductive layer (not shown) such as a MOS transistor, a conductive pad or a bit line may be formed between the semiconductor substrate 200 and the interlayer insulating layer 210. A contact plug 215 is formed on a portion of the interlayer insulating layer 210, using a well-known method. The contact plug 215 may be a doped polysilicon layer or a titanium nitride layer, and the contact plug 215 may be electrically connected to the source of a MOS transistor (not shown), or to a conductive pad (not shown), which is electrically connected to the source. On the interlayer insulating layer 210 and the contact plug 215, an etch stopper 220 and a first insulation layer 225 are sequentially deposited. A layer having etch selectivity with the first insulation layer 225 may be used as the etch stopper 220. For example, a silicon nitride layer may be used as the etch stopper 220. The first insulation layer 225 is an oxide layer for molding in order to define the height and the shape of the capacitor. For example, the first insulation layer may be formed up to the same height as the lower electrode of the capacitor. The first insulation layer 225 and the etch stopper 220 define a lower electrode area 230 after etching to expose the contact plug 215.

If forming the contact plug 215 of poly-silicon, a transition metal layer (not shown) such as titanium, tantalum or tungsten is formed on the surface of the lower electrode area 230 and the first insulating layer 225. In the present embodiment, a titanium layer is used as the transition metal layer, and may be formed by CVD at about 600 to 650° C. Also, the transition metal layer may be formed to about 80 to 90 Å. After performing a thermal process on the transition metal layer, a silicide layer 235a is formed on the poly-silicon contact plug 215. If the thermal process is performed in a nitrogen atmosphere, the transition metal layer transforms into a metal nitride layer 235b. The metal nitride layer 235b does not eliminate. If the transition metal layer is thermal processed in another gas atmosphere, the remaining transition metal layer can be eliminated.

Figure 3B:
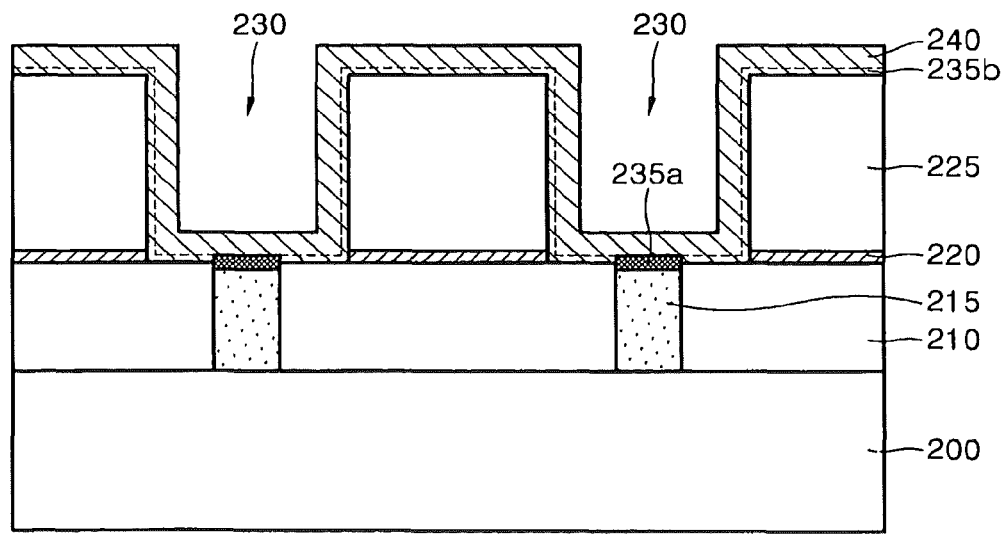

Referring to FIG. 3B, a metal nitride layer 240 is formed on the lower electrode area 230 and the first insulation layer 225 as a lower electrode. For example, the metal nitride layer 240 may be a titanium nitride layer, a tantalum nitride layer or a tungsten nitride layer. In the present embodiment, the titanium nitride layer is used as the metal nitride layer 240. Preferably, the metal nitride layer 240 may be identical to the remaining metal transition nitride layer 235b. The metal nitride layer 240 may be formed using CDV, ALD or SFD.

Figure 4:
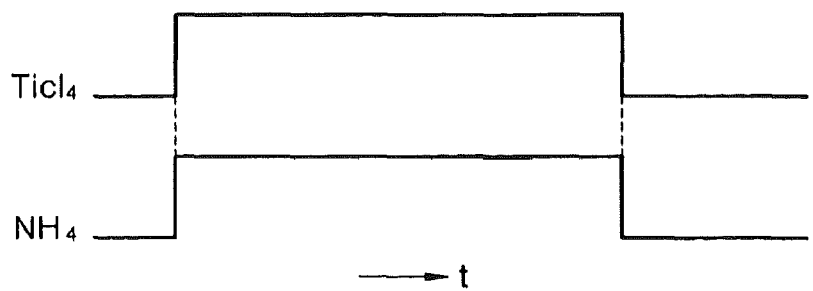
FIG. 4 is a view of forming a titanium nitride layer by CVD.
Figure 5:
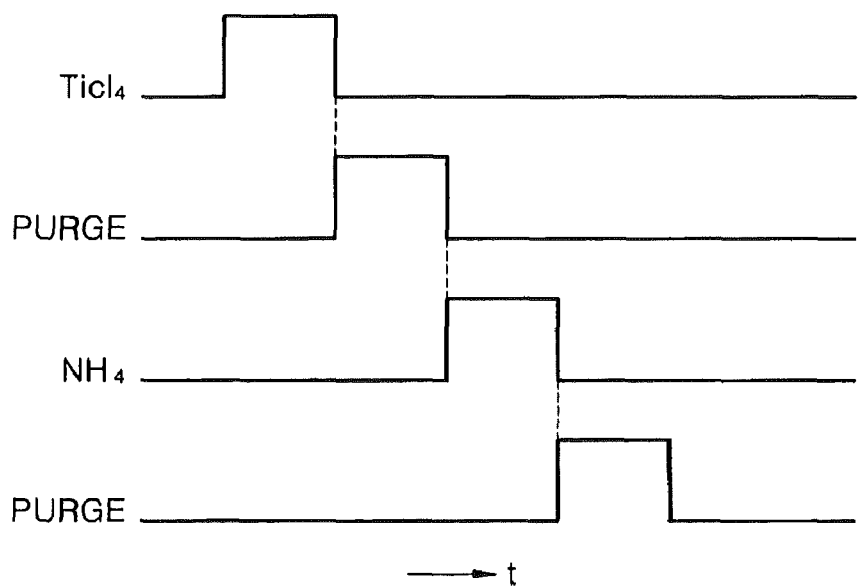
FIG. 5 is a view of forming a titanium nitride layer by ALD.

A method of forming the metal nitride layer, i.e., the titanium nitride layer, based on the CVD scheme as shown in FIG. 4 includes simultaneously supplying a titanium source such as a titanium chloride source (TiCl4) and nitric acid (NH4) in a chamber within a fixed time. In contrast, a method of forming a titanium nitride layer by ALD, as shown in FIG. 5, includes supplying a titanium chloride source within a fixed time, purging, and then supplying a nitric acid source.

Figure 6:
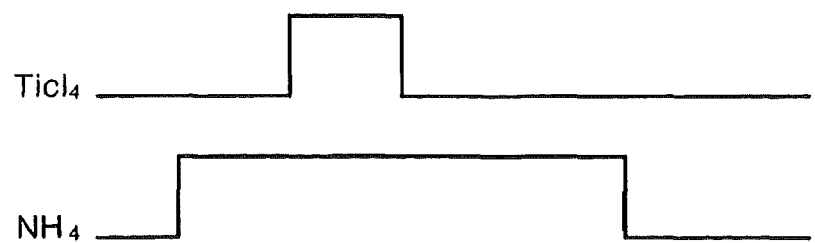
FIG. 6 is a view of forming a titanium nitride layer by SFD.

Meanwhile, a method for forming a titanium nitride layer by SFD as shown in FIG. 6 includes supplying a nitric acid source, simultaneously supplying the nitric acid source and a titanium chloride source after the nitric acid source is supplied within a fixed time, and continually supplying the nitric acid source after removing the titanium chloride source. This SFD method creates an atmosphere for preventing the chlorine (Cl) of the titanium chloride source from percolating into the interlayer insulating layer 210 and the contact plug 215. For eliminating the chlorine (Cl) when the titanium chloride source is supplied, the nitric acid source is supplied for a fixed time after supplying the titanium chloride source (H+Cl→HCl↑).

The metal source for forming a metal nitride layer generally includes chlorine, which generates stress, defects or cracking in the metal nitride layer by percolating through the interlayer insulating layer 210 and the contact plug 215. Furthermore, the chlorine degrades interface characteristics between a metal nitride layer and the etch stopper 220. However, if the metal nitride layer 240 is deposited by SFD, the problems caused by chlorine can be reduced by supplying a source for eliminating the chlorine before or after feeding a metal source containing chlorine. It is preferable that the metal nitride layer 240 is deposited at a temperature of 300 to 600° C. and a pressure of 1 to 10 Torr, preferably 2 to 3 Torr.

Figure 3C:
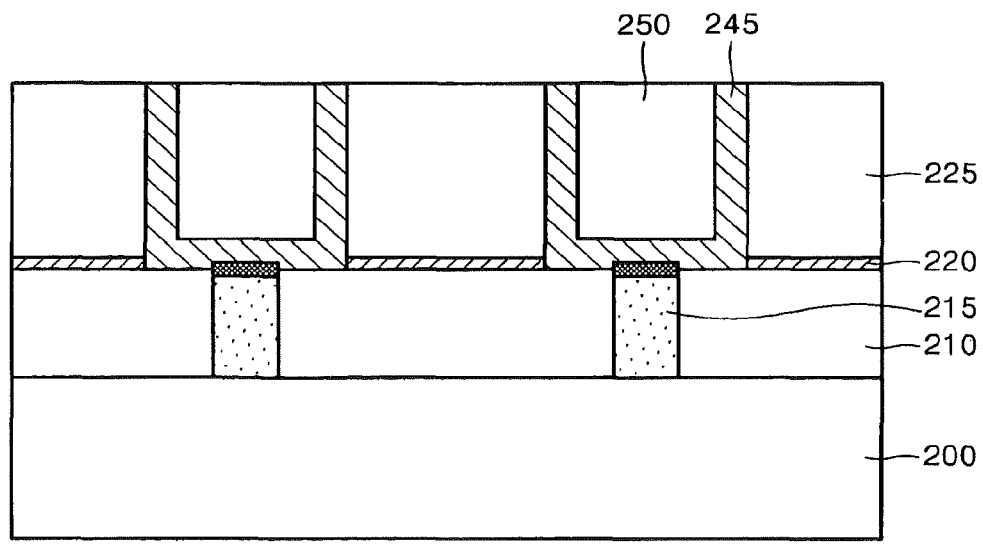

Referring to FIG. 3C, a second dielectric film 250 is deposited on the metal nitride layer 240. The second dielectric film 250 is a sacrificial layer, for example, a silicon nitride layer. A lower electrode 245 is formed by planarizing the second dielectric film 250 and the metal nitride layer 240 until the first insulation layer 225 is exposed. Chemical mechanical polishing or etchback may be used for planarizing.

Figure 3D:
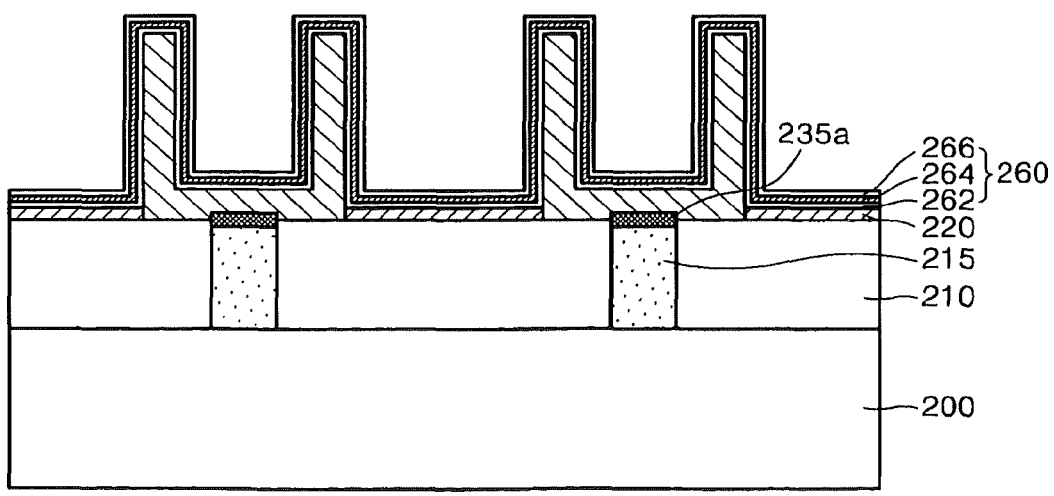

As shown in FIG. 3D, the first insulation layer 225 and the second insulation layer 250 are removed by wet etching. After removal, a first hafnium oxide layer 262 is evaporated on the surface of the etch stopper 220 and the lower electrode 245, as a first dielectric film. The first hafnium oxide layer 262 may be formed to 1 to 10 nm thick when a design rule of less than 100 nm is applied to a DRAM device. Also, it is preferable to use ALD for forming the first hafnium oxide layer 262.

Figure 7A:
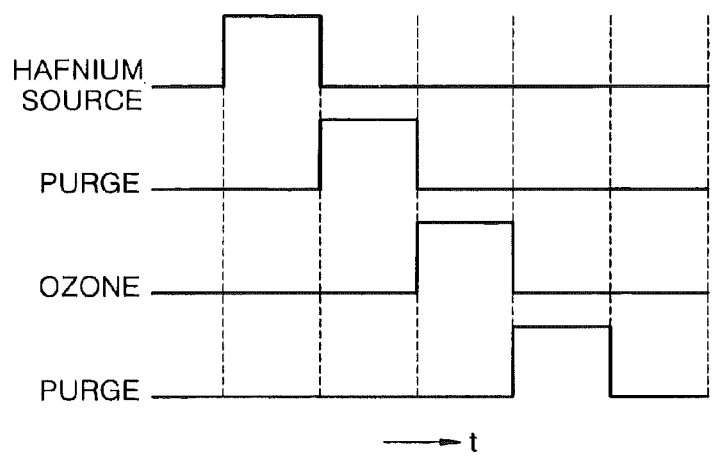
FIGS. 7A and 7B are views for explaining a method of evaporating a dielectric film according to an embodiment of the present invention.

When forming the first hafnium oxide layer 262 by ALD, one cycle for forming a single hafnium oxide layer as shown in FIG. 7A includes supplying a hafnium source to a reaction chamber, purging the inside of the reaction chamber, supplying ozone O3, and purging. The first hafnium oxide layer 262 should have superior step coverage characteristics since it is formed on the surface of the lower electrode 245, which has a high aspect ratio.

Figure 7B:
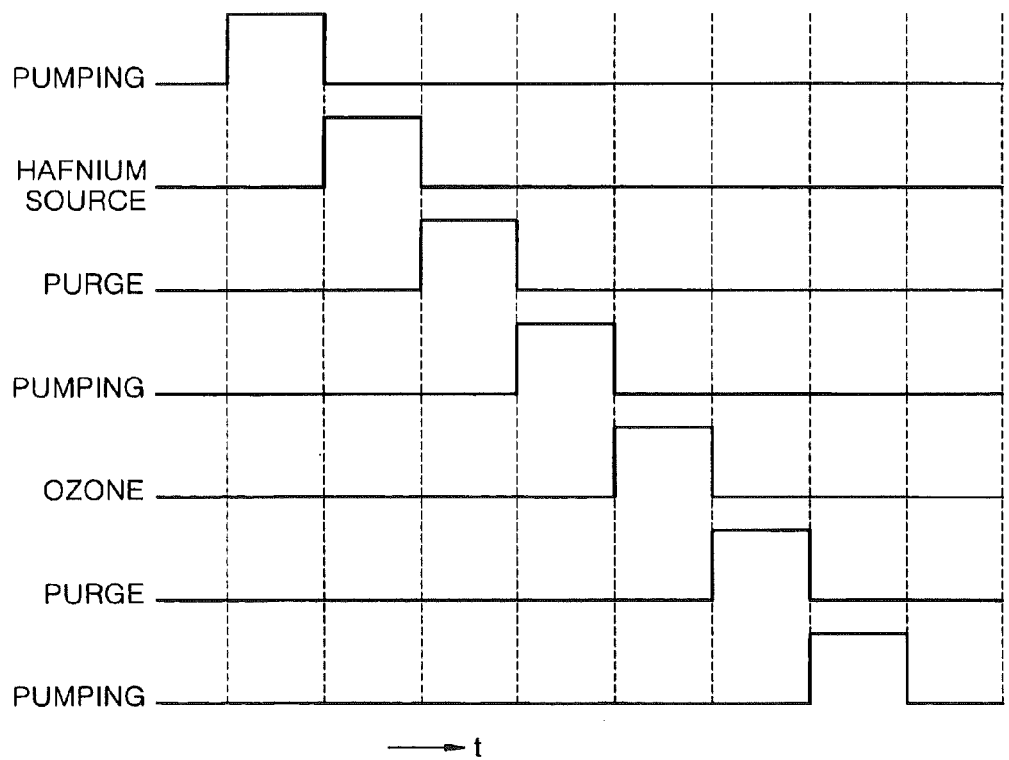

To improve the step coverage characteristics of the first hafnium oxide layer 262 in the present embodiment, a pumping process is performed before supplying a reaction source. That is, the pumping process is performing inside the reaction chamber (not shown) before supplying the hafnium source as shown in FIG. 7B, for eliminating remaining impurities from the surface of the lower electrode 245. After the pumping process, an argon source (Ar) is supplied to purge the resulting product, leaving a single hafnium oxide layer on the surface of the lower electrode 245. After purging, an additional pumping process is performed for eliminating impurities and argon from the surface of the resulting product. After the pumping process, the argon (Ar) is supplied again for purging reaction remnants from the surface of the single hafnium oxide layer. Purging the reaction remnants completes one cycle of forming a single hafnium oxide layer. Before performing the next cycle, a pumping process is performed to eliminate argon components from the surface of the hafnium oxide layer.

The argon gas supplied for the purging process eliminates compositions, which are not chemically absorbed. However, the argon gas has very low reactivity with other gases. If the argon gas remains on a surface without being completely eliminated, a reaction source supplied next is not uniformly absorbed into the surface. Accordingly, in the present embodiment, a pumping process is performed to eliminate the argon gas and any impurities remaining, before supplying the reaction source. By performing the pumping process, the reaction source is uniformly chemically absorbed into the surface of the resulting product. As a result, the step coverage characteristics of the hafnium oxide layer 262 are improved. While forming the single hafnium oxide layer, each of the operations is performed for 0.1 to 10 seconds, and it is preferable that each cycle is completed in less than 20 seconds. To increase throughput, the pumping process may be performed only when each cycle is started or ended, although it is preferable that the pumping process is performed each time a reaction source is supplied, as described above. The hafnium source may be one of tetrakis-ethyl methyl amino hafnium, Hf[NC2H5CH3]4 (TEMAH), tetrakis diethyl amino hafnium, Hf[N(C2H5)2]4 (TDEAH), tetrakis-dimethyl amino hafnium, Hf[N(CH3)2]4 (TDMAH), Hf[N(C3H7)2]4 or Hf[N(C4H9)2]4.

Figure 8A:
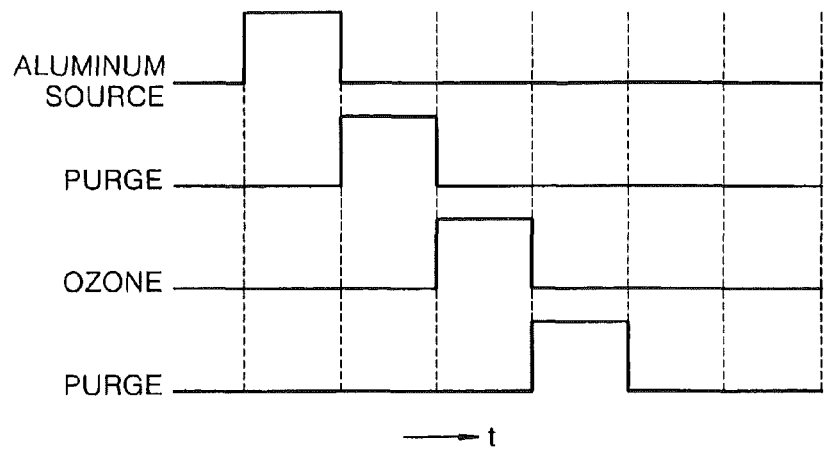
FIGS. 8A and 8B are views for explaining a method of evaporating a crystallization prevention layer according to an embodiment of the present invention.

An aluminum oxide layer 264 is deposited on the first hafnium oxide layer 262 as a crystallization preventing layer. The aluminum oxide layer 264 may be thinner than the first hafnium oxide layer 262, (e.g., 0.1 to 2 nm thick). The aluminum oxide layer 264 may be formed by an ALD method. When forming the aluminum oxide layer 264 by ALD, one cycle of forming the aluminum oxide layer generally includes supplying an aluminum source to a reaction chamber, purging the inside of the reaction chamber, and supplying and purging ozone O3 as shown in FIG. 8A.

Figure 8B:
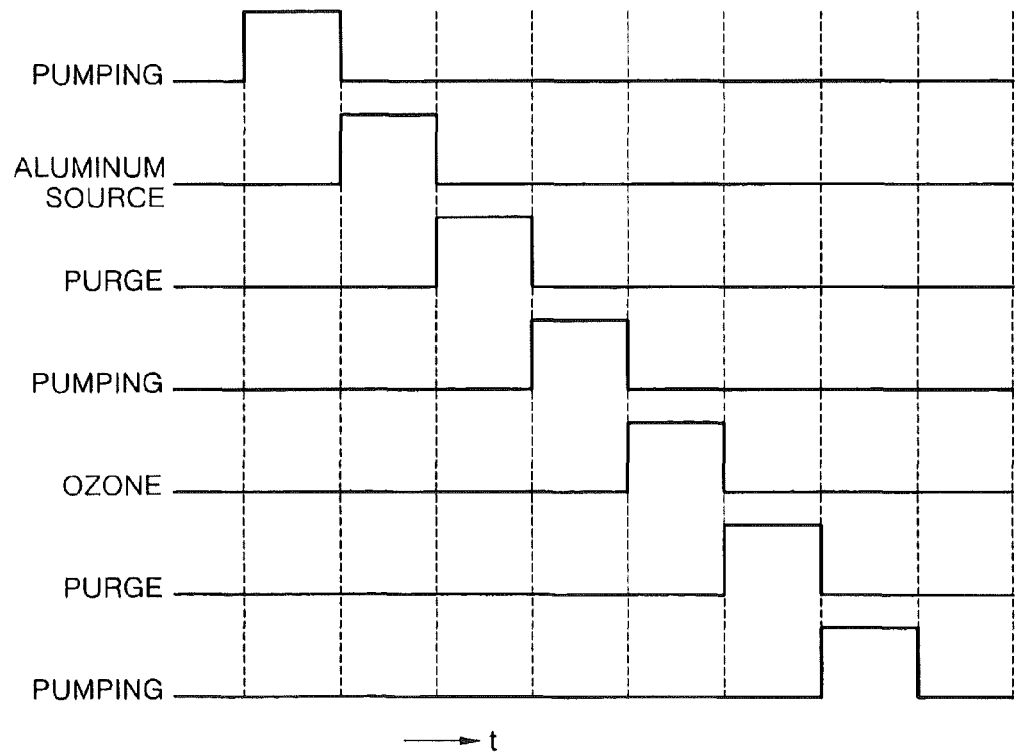

When depositing the aluminum oxide layer 264, a pumping process may be performed before supplying a reaction source, to improve the step coverage characteristics. That is, the pumping process is performed for eliminating impurities remaining on the surface of the first hafnium oxide layer 262 before supplying the aluminum source as shown in FIG. 8B. After the pumping process, the aluminum source is supplied and an argon source is supplied to purge the surface of the resulting product, in order to absorb an aluminum atom layer on the surface of the first hafnium oxide layer 262. After purging, an additional pumping process is performed for eliminating the argon composition remaining on the surface of resulting product. After the additional pumping process, ozone O3 is supplied for forming a single aluminum oxide layer on the surface of the resulting product. Argon is then supplied again to the reaction chamber for purging reaction remnants remaining on the surface of the single aluminum oxide layer. Purging the reaction remnants completes one cycle of forming the single aluminum oxide layer. Before performing another cycle, a pumping process is performed for eliminating argon composition remaining on the upper aluminum oxide layer. As described above, if the pumping process is additionally performed before supplying the reaction source such as the aluminum source and the ozone, the step coverage characteristic is improved. Furthermore, the additional pumping processes helps transfer atoms to areas where the deposition is low, such as the edges, which improves the step coverage characteristics. In the present embodiment, the ozone supplying process and the purging process may be performed for a comparatively long time, for example, twice as long as in the conventional method. That is, in the conventional method, the ozone supplying process and the purging process are performed for 1 to 5 seconds. However, in the present embodiment, the ozone supplying process and the purging process are performed for 2 to 10 seconds. By extending the time of the ozone supplying process and the purging process, penetration of the aluminum source and the ozone is improved, and as a result, the step coverage characteristics are further improved.

A second hafnium oxide layer 266 is deposited on the aluminum oxide layer 264 for forming a capacitor dielectric film 260. The second hafnium oxide layer 266 may be formed to 1 to 10 nm thick by the same method as the first hafnium oxide layer 262. The first hafnium oxide layer 262, the aluminum oxide layer 264 and the second hafnium oxide layer 266 are deposited under a pressure of 1 to 10 Torr.

Figure 13:
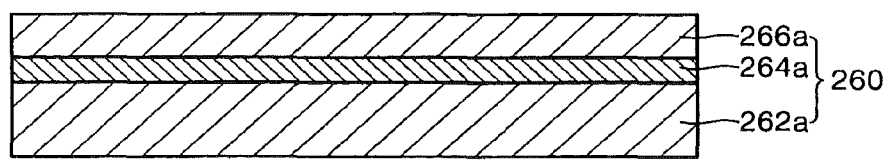
FIG. 13 is a cross sectional view of a capacitor according to another embodiment of the present invention.

The first hafnium oxide layer 262 and the second hafnium oxide layer 266 may be formed to the same or different thicknesses. Preferably, the first hafnium oxide layer 262a is thicker than the second hafnium oxide layer 266a, as shown in FIG. 13. Since the lower electrode 220 generally has a cylinder shape or a concave shape, an electric field converges at the edges and surface of the lower electrode may be unstable. If the first hafnium oxide layer 262a is thicker than the second hafnium oxide layer 266a on such a surface of the lower electrode 220, the convergence of the electric field at the edges of the lower electrode 220 can be reduced. Accordingly, the stability of dielectric film is improved and thus the leakage current of the capacitor dielectric film 260 is reduced.

After forming the dielectric film 260, a subsequent process is performed on the dielectric film 260. The subsequent process may be, for example, a plasma process. Direct plasma, remote plasma or modified magnetron type plasma may be used. Also, the plasma process may be performed for 3 to 8 minutes at a temperature of 150 to 400° C., preferably about 250° C. and at several Torr, e.g., 1.5 Torr. The plasma process may be performed in a gas atmosphere such as O2, N2, NH3, H2 or N2O gas. If an oxygen plasma process is used, oxygen is applied to the dielectric film 260 to prevent a shortage of oxygen in the dielectric film 260. Therefore, the electric characteristics of the capacitor are improved.

Figure 3E:
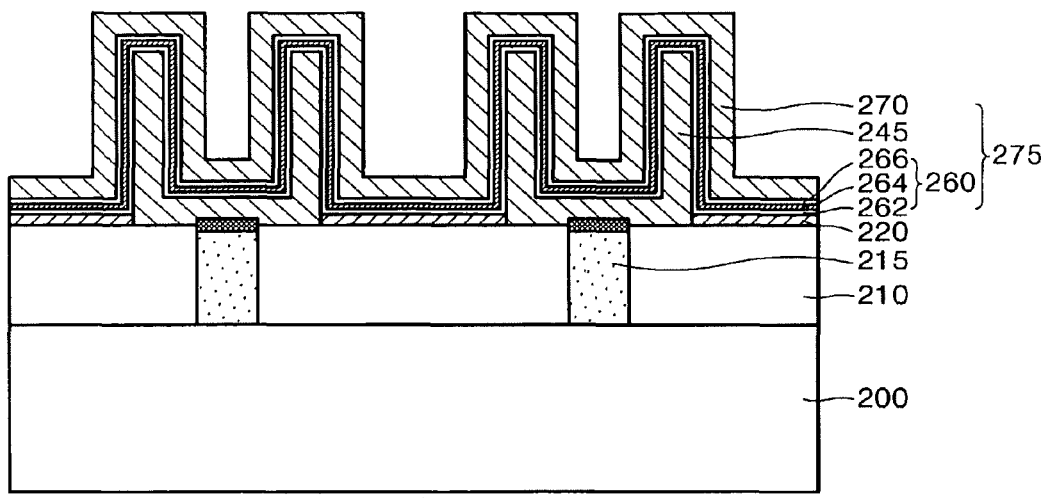

Referring to FIG. 3E, a top electrode 270 is formed on the capacitor dielectric film 260 to form a capacitor 275. For example, a metal nitride layer can be used for the top electrode 270. The metal nitride layer for the top electrode 270 may be of the same material as the lower electrode 245, and preferably, the top electrode 270 is formed by the same method as the metal nitride layer for the lower electrode 240.

Figure 3F:
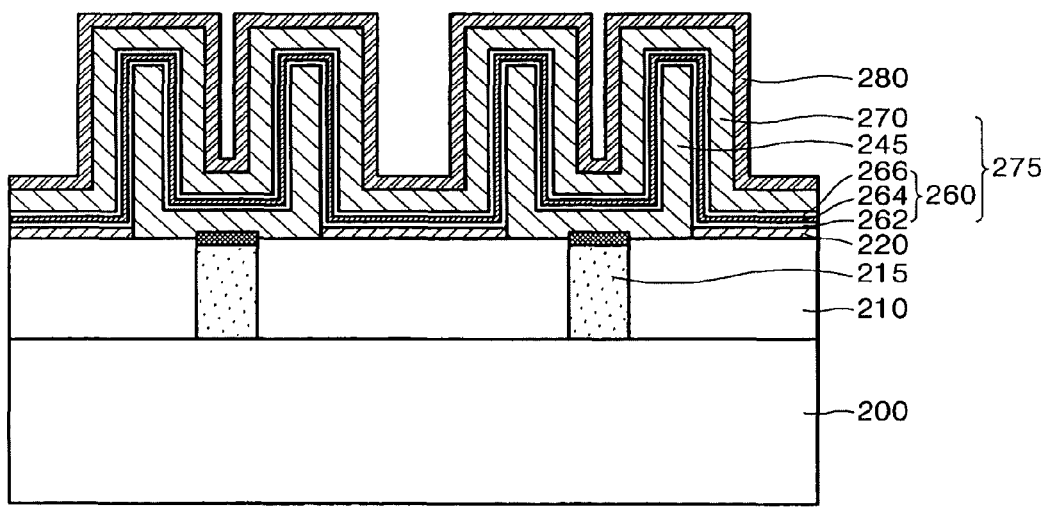

Referring to FIG. 3F, a capping layer 280 is formed on the top electrode 270. The capping layer 280 is provided to improve adhesion to an insulating layer (not shown) to be formed later. For example, a silicon germanium layer (SiGe), a polysilicon layer or a tungsten (W) layer may be used for the capping layer 280. Especially, since the silicon germanium layer is formed at a lower temperature, (e.g., lower than 450° C.), the bottom capacitor 275 is not thermally influenced by the capping layer when the capping layer is evaporated.

Figure 9:
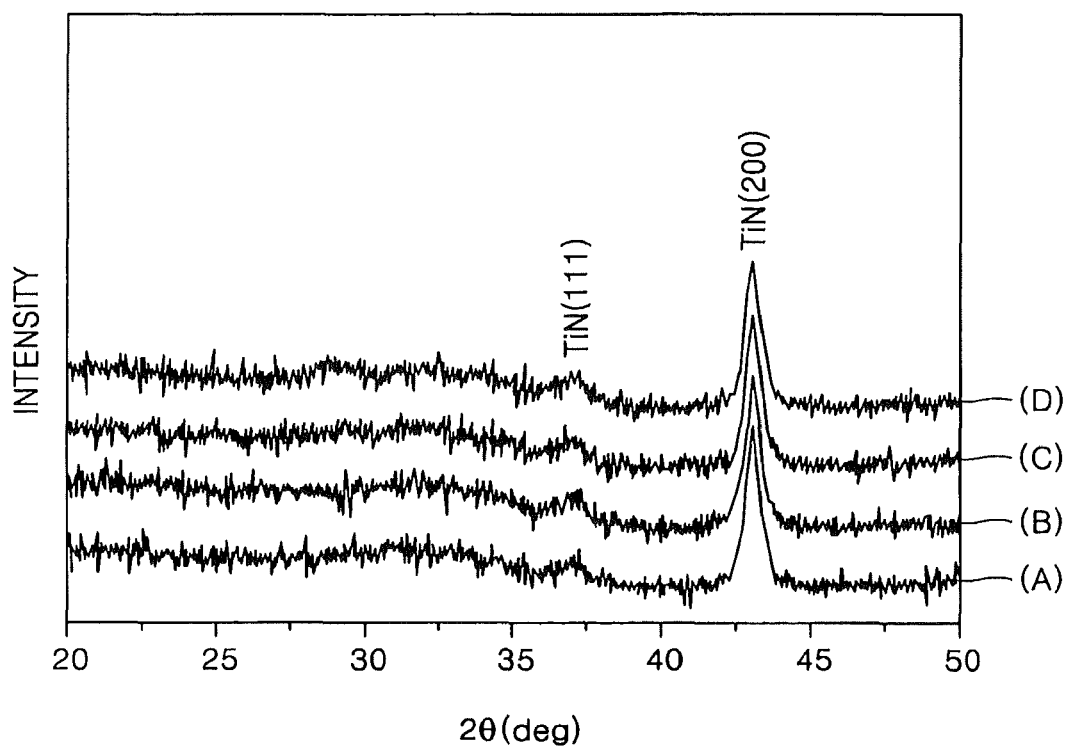
FIG. 9 is a graph showing a crystal peak of a capacitor dielectric film according to an embodiment of the present invention.

FIG. 9 is a graph showing a crystal peak of a capacitor dielectric film according to an embodiment of the present invention. FIG. 9 shows the crystal peak of a capacitor dielectric film having the structure of a hafnium oxide layer/an aluminum oxide layer/a hafnium oxide layer. Each of the hafnium oxide layers is formed to a thickness of 30 Å, and the aluminum oxide layer is formed to a thickness of 2 Å. A curve (A) shows a crystal peak of a capacitor dielectric film as deposition, a curve (B) shows a crystal peak of a capacitor dielectric film processed at 500° C. as deposition, a curve (C) shows a crystal peak of a capacitor dielectric film processed at 537° C. as deposition, and a curve (D) shows a crystal peak of a capacitor dielectric film processed at 550° C. as deposition.

As shown in FIG. 9, there is no crystal peak in the curves (B) and (C) after a back-end thermal process, when the capacitor dielectric film having the structure of hafnium oxide/aluminum oxide/hafnium oxide is used. Therefore, it can be expected that no leakage current is generated by crystal defects of the capacitor dielectric film.

Figure 10:
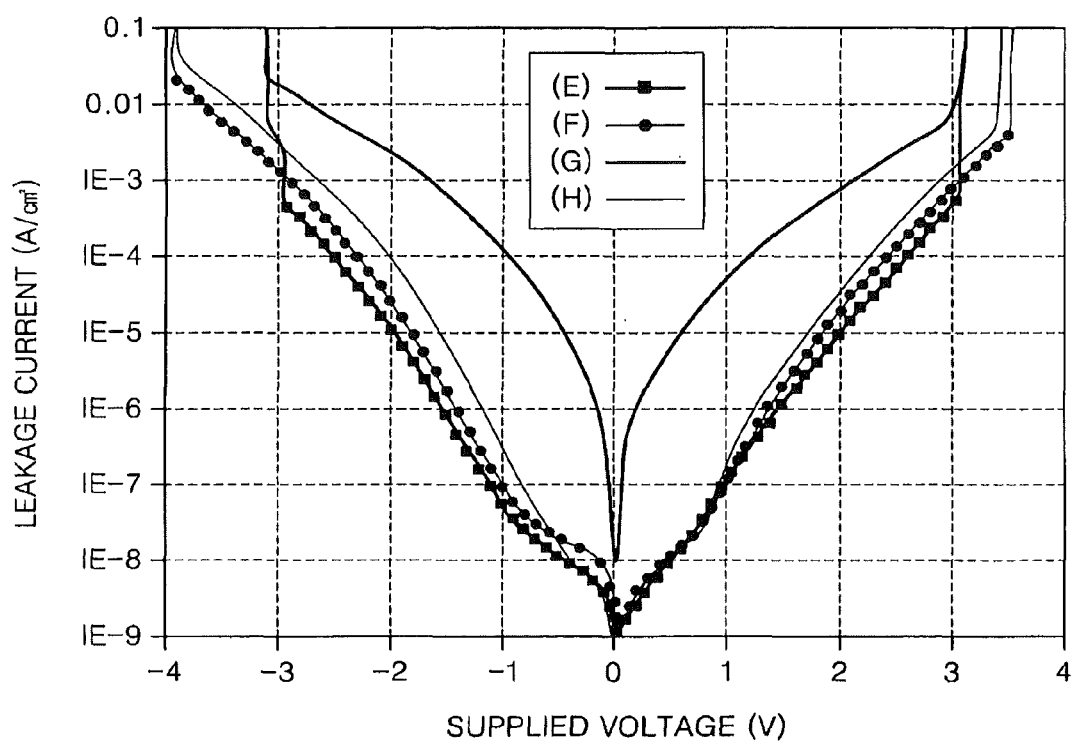
FIG. 10 is a graph showing the leakage current of a capacitor dielectric film according to an embodiment of the present invention.

FIG. 10 is a graph showing the leakage current of a capacitor dielectric film according to an embodiment of the present invention. In FIG. 10, curves (E) and (G) show the leakage current for a single hafnium oxide layer having a thickness of 60 Å, curves (F) and (H) show the leakage current for a capacitor dielectric film having the structure of a hafnium oxide layer 30 Å thick/an aluminum oxide layer 2 Å thick/a hafnium oxide layer 30 Å thick. Curves (E) and (F) show the leakage current after deposition, and curves (G) and (H) show the leakage current after performing a back-end process at 500° C.

As shown in FIG. 10, a conventional capacitor dielectric film having a single hafnium oxide layer and the capacitor dielectric film having the structure of hafnium oxide/aluminum oxide/hafnium oxide generate low leakage current. However, after the back-end process at 500° C., the conventional capacitor dielectric film having the single hafnium oxide layer generates a higher leakage current, while the capacitor dielectric film having the structure of hafnium oxide/aluminum oxide/hafnium oxide according to the present embodiment generates a comparatively low leakage current.

Therefore, if the capacitor dielectric film is formed to have the structure of a hafnium oxide layer/an aluminum oxide layer/a hafnium oxide layer according to the present embodiment, the capacitor leakage characteristics are improved.

Figure 11:
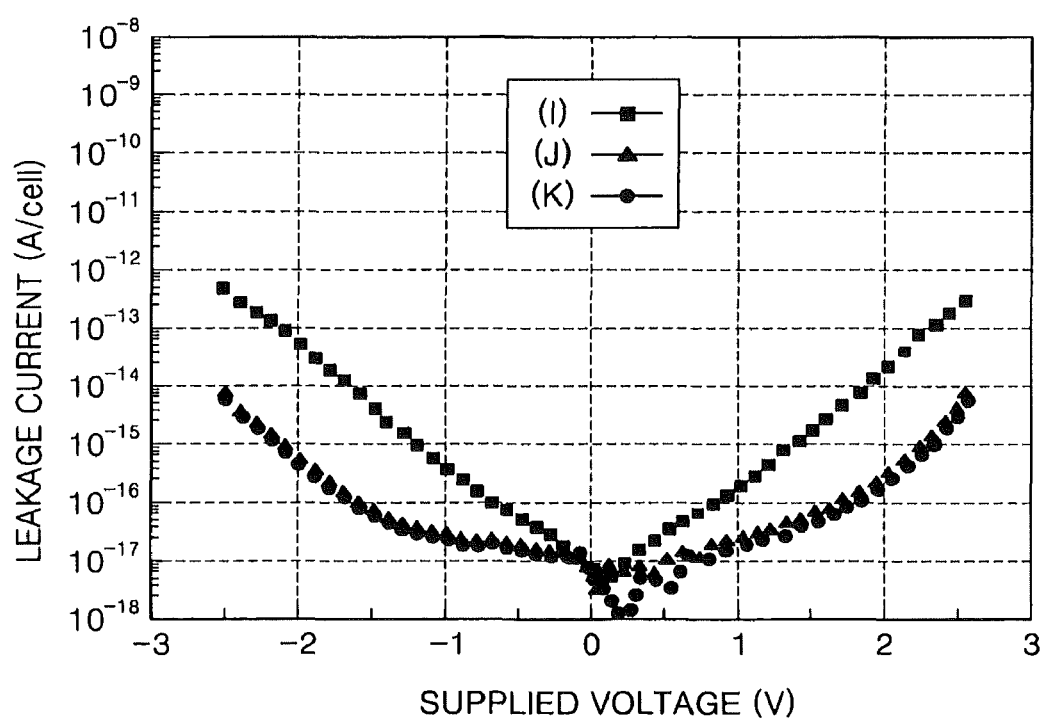
FIG. 11 is a graph showing a capacitor leakage current according to an embodiment of the present invention.

FIG. 11 is a graph depicting capacitor leakage current according to an embodiment of the present invention. In FIG. 11, curve (I) shows the leakage current in a capacitor having the structure of titanium nitride/hafnium oxide/titanium nitride, curve (J) shows the leakage current in a capacitor having the structure of titanium nitride/hafnium oxide (35 Å)/aluminum oxide (5 Å)/hafnium oxide (35 Å)/a titanium nitride, and curve (K) shows the leakage current in a capacitor having the structure of titanium nitride/hafnium oxide (35 Å)/aluminum oxide (2 Å)/hafnium oxide (35 Å)/titanium nitride. After a back-end process is performed, the capacitors according to the present embodiment show low leakage current, as seen in the curves (J) and (K), while the conventional capacitor shows comparatively large leakage current as seen in the curve (I).

Figure 12:
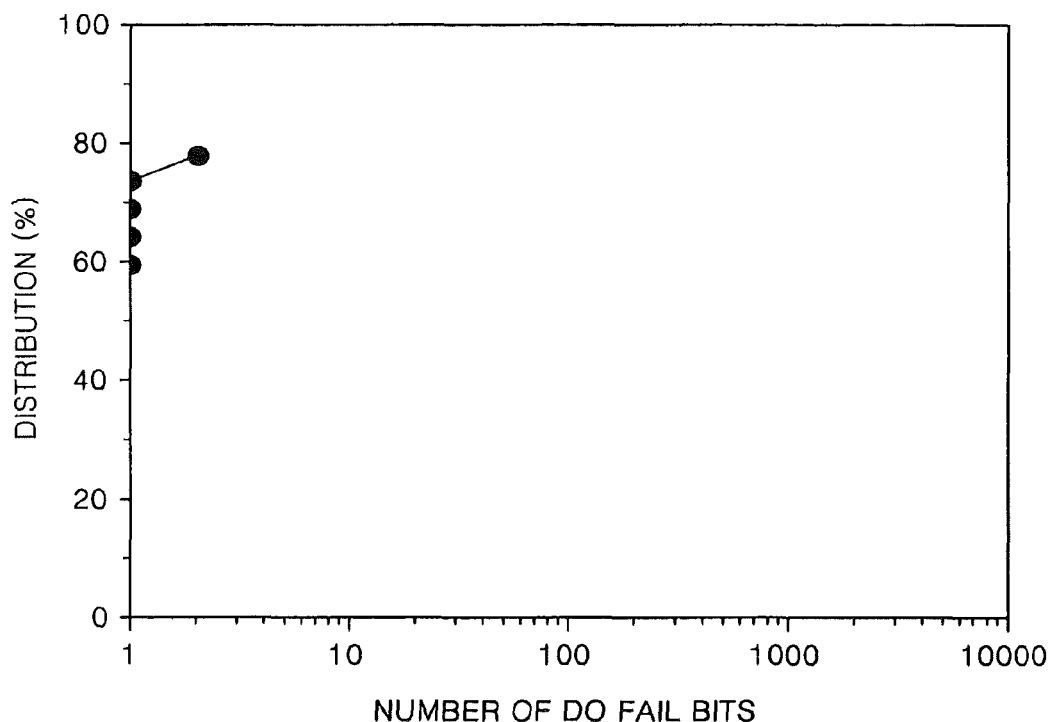
FIG. 12 is a graph showing the yield of a capacitor according to an embodiment of the present invention.

FIG. 12 is a graph showing the yield of a capacitor according to an embodiment of the present invention. The graph of FIG. 12 shows the distribution of failure (yield) after performing a 0(DO) test, where 0 is input to the capacitor. The graph of FIG. 12 shows that if the capacitor dielectric film having the structure of a hafnium oxide layer/an aluminum oxide layer/a hafnium oxide layer according to the present embodiment is used, there are almost no failed bits based on 50%. This means that the reliability of the capacitor according to the present embodiment is superior.

As shown in the graph of FIG. 12, the capacitor dielectric film having the structure of a hafnium oxide layer/an aluminum oxide layer/a hafnium oxide layer according to the present embodiment provides superior reliability in highly integrated DRAM devices.

Figure 14:
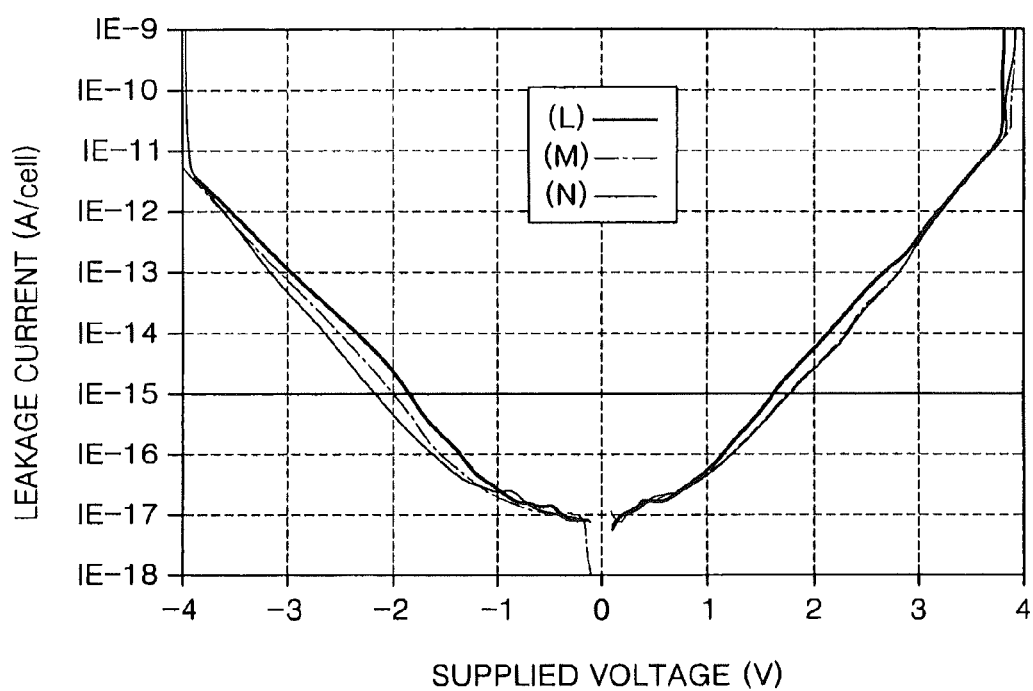
FIG. 14 is a graph showing leakage currents of a capacitor dielectric film for various thicknesses of a first hafnium oxide layer and a second hafnium oxide layer.

FIG. 14 is a graph showing leakage currents of a capacitor dielectric film for various thicknesses of the first hafnium oxide layer and the second hafnium oxide layer. In FIG. 14, curve (L) shows the leakage current in a capacitor dielectric film including a first oxide layer 25 Å thick/an aluminum oxide layer 2 Å thick/a second hafnium oxide layer 30 Å thick. Curve (M) shows the leakage current in a capacitor dielectric film including a first oxide layer 30 Å thick/an aluminum oxide layer 2 Å thick/a second hafnium oxide layer 25 Å thick, and curve (N) shows the leakage current in a capacitor dielectric film including a first oxide layer 35 Å thick/an aluminum oxide layer 2 Å thick/a second hafnium oxide layer 20 Å thick. As shown in FIG. 14, the curve (N) shows that the capacitor having the thicker first hafnium oxide layer has most stable leakage current characteristics. This is because the convergence of the electric field at the edges of the lower electrode 220 can be reduced by forming the first hafnium oxide layer 262a, which contacts the lower electrode 220 as described above, comparatively thicker.

Figure 15:
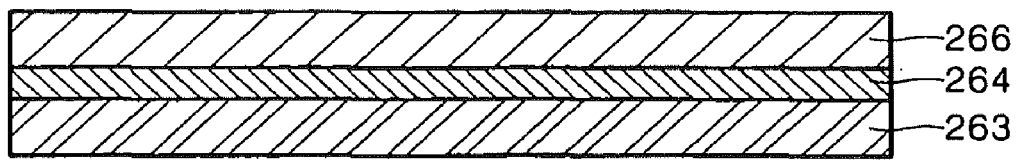
FIGS. 15 through 17 show cross sectional views showing a capacitor dielectric film according to another embodiment of the present invention.
Figure 16:
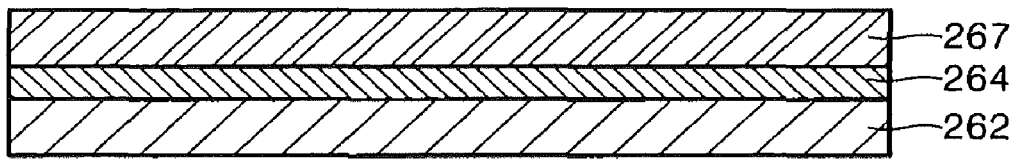
Figure 17:
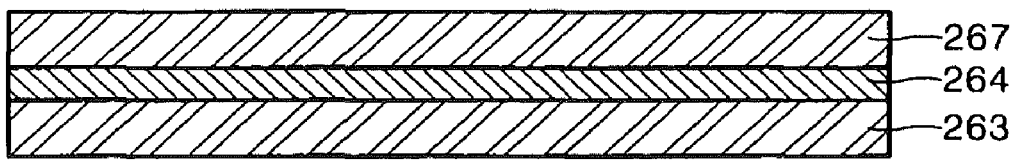

FIGS. 15 through 17 show cross sectional views of a capacitor dielectric film for explaining another embodiment of the present invention. In the present embodiment, at least one of the first hafnium oxide layer and the second hafnium oxide layer may be a hafnium nitride layer (HfON) including a nitrogen composition. That is, the dielectric film of the present embodiment may have the structure of either hafnium nitride 263/aluminum oxide 264/hafnium oxide 266 as shown in FIG. 15, hafnium oxide 262/aluminum oxide 264/hafnium nitride 267 as shown in FIG. 16, or hafnium nitride 263/ aluminum oxide 264/hafnium nitride 267. The hafnium nitride layer 263 or 267 is formed by nitrifying a hafnium oxide layer. The hafnium nitride layer is formed by an ALD method including a pumping process, which is performed on the hafnium oxide layer before nitrifying. After evaporating a hafnium oxide layer, a plasma process with nitrogen such as an NH3 plasma process is performed for forming a hafnium nitride layer 263 or 267.

Figure 18:
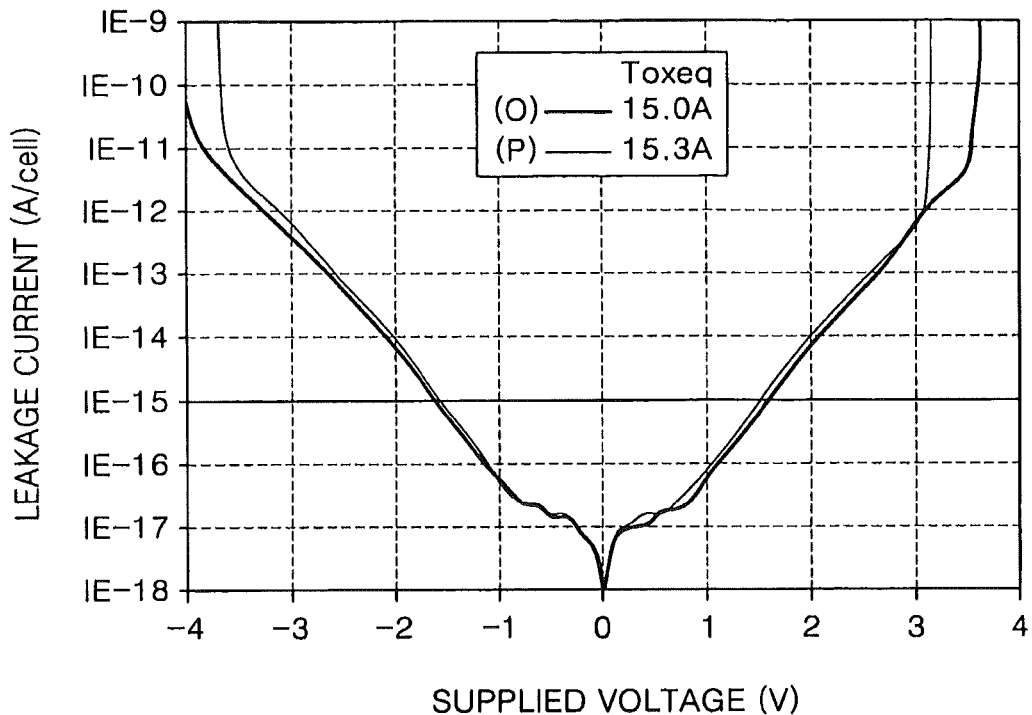
FIG. 18 is a graph showing a capacitor leakage current when using a dielectric film having a hafnium nitride layer.

FIG. 18 is a graph showing a capacitor leakage current when using a dielectric film having a hafnium nitride layer. In FIG. 18, curve (O) shows the capacitor leakage current when a dielectric film having the structure of hafnium nitride (35 Å)/aluminum oxide (5 Å)/hafnium oxide (35 Å) is used, and curve (P) shows the capacitor leakage current when a dielectric film having the structure of hafnium oxide (35 Å)/aluminum oxide (5 Å)/hafnium oxide (35 Å) is used. As shown in FIG. 18, the leakage currents of the dielectric film of the curve (O) and the dielectric film of the curve (P) are stable. In the case of the dielectric film of the curve (O), the Vtoff voltage is reduced to about 0.4V. Also, when using a hafnium nitride layer according to the present embodiment, the thickness of the equivalent oxide layer is reduced by about 0.3 Å. Since the hafnium nitride layer includes a nitrogen composition having low reactivity in the film, the dielectric film having the hafnium nitride layer has superior stability characteristics.

Figure 19:
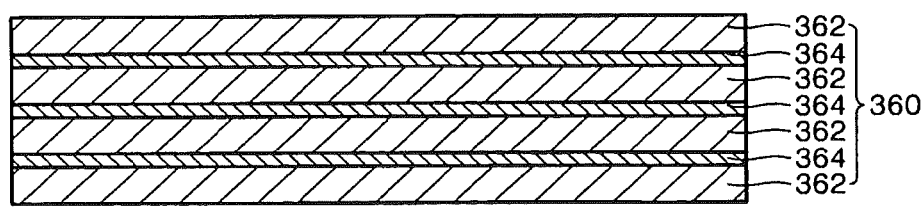
FIG. 19 is a cross sectional view of a dielectric film of another embodiment of the present invention.

FIG. 19 is a magnified cross sectional view of a dielectric film according to another embodiment of the present invention. As shown in FIG. 19, hafnium oxide layers 362 and aluminum oxide layers 364 are alternately stacked to form the dielectric film 360. Since at least one aluminum oxide layer 364 having a high crystallization temperature is present in the dielectric film 360, the crystallization temperature of the dielectric film is further lowered.

The above-mentioned embodiments do not limit the present invention. In these embodiments, the hafnium oxide layer is used as the first and second dielectric films. However, a zirconium oxide layer, a lanthanum oxide layer or an oxide layer including nitrogen may be used as the first and second dielectric films. Also, the aluminum oxide layer is used as the crystallization prevention layer in the present embodiments. However, a dielectric film having a different composition from the first and second dielectric films, such as a zirconium oxide layer, a lanthanum oxide layer, a hafnium oxide layer or an oxide layer including nitrogen may be used as the crystallization prevention layer. Furthermore, an insulating layer having a lower crystallization temperature than the first and second dielectric films, such as an aluminum nitride layer or a silicon nitride layer, may be used.

As described above, a crystallization prevention layer is inserted into a dielectric film of a MIM capacitor having the structure of a titanium nitride layer/a hafnium oxide layer/a titanium nitride layer, in the present embodiment. The aluminum oxide layer has a higher crystallization temperature than the hafnium oxide layer, and is used as the crystallization prevention layer in the present embodiment.

By inserting the crystallization prevention layer into the dielectric film, the leakage current of the capacitor can be reduced. Furthermore, the dielectric film having the crystallization prevention layer can be used for a DRAM device having a design rule of less than 100 nm, since the hafnium oxide layer has superior equivalent oxide layer properly which determine dielectric characteristics, compared to other dielectric film. Furthermore, since a titanium nitride layer is used as the lower electrode, manufacturing cost is reduced. Moreover, by performing additional pumping processes when the dielectric film is evaporated, the step coverage characteristics of the dielectric film are further improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An integrated circuit capacitor, comprising:
   lower and upper capacitor electrodes;
   a capacitor dielectric layer extending between said lower and upper capacitor electrodes, said capacitor dielectric layer comprising a composite of a first dielectric layer comprising a zirconium-containing oxide extending directly on the lower electrode, a second dielectric layer comprising a zirconium-containing oxide extending on the upper electrode and a third dielectric layer extending directly on the first dielectric layer, said third dielectric layer having a higher crystallization temperature relative to the first and second dielectric layers and a thickness less than a thickness of the first dielectric layer and a thickness of the second dielectric layer; and
   a capping layer on said upper capacitor electrode, said capping layer comprising a material selected from a group consisting of silicon germanium, polysilicon and tungsten.

2. An integrated circuit capacitor, comprising:
   lower and upper capacitor electrodes; and
   a capacitor dielectric layer extending between said lower and upper capacitor electrodes, said capacitor dielectric layer comprising a composite of a first dielectric layer comprising a zirconium-containing oxide extending directly on the lower electrode, a second dielectric layer comprising a zirconium-containing oxide extending on the upper electrode and a third dielectric layer extending directly on the first dielectric layer, said third dielectric layer having a higher crystallization temperature relative to the first and second dielectric layers and a thickness less than a thickness of the first dielectric layer and a thickness of the second dielectric layer;
   wherein at least one of the first and second dielectric layers comprises a nitrogen-doped zirconium-containing oxide.

3. The capacitor of claim 2, wherein said third dielectric layer is sufficiently thick to cause a crystallization temperature of said capacitor dielectric layer to be greater than a crystallization temperature of the first dielectric layer.

4. The capacitor of claim 2, wherein said third dielectric layer is sufficiently thick to cause a crystallization temperature of said capacitor dielectric layer to be greater than a crystallization temperature of the second dielectric layer.

5. The capacitor of claim 2, wherein the first and third dielectric layers are alternately stacked two or more times.

6. The capacitor of claim 2, wherein the first and second dielectric layers have thicknesses in a range between 1 nm and 10 nm; and wherein the third dielectric layer has a thickness in a range between 0.1 nm and 2 nm.

7. An integrated circuit capacitor, comprising:
lower and upper capacitor electrodes; and
a capacitor dielectric layer extending between said lower and upper capacitor electrodes, said capacitor dielectric layer comprising a composite of a first dielectric layer comprising a zirconium-containing oxide extending directly on the lower electrode, a second dielectric layer comprising a zirconium-containing oxide extending on the upper electrode and a third dielectric layer extending directly on the first dielectric layer, said third dielectric layer having a higher crystallization temperature relative to the first and second dielectric layers and a thickness less than a thickness of the first dielectric layer and a thickness of the second dielectric layer;
wherein at least one of the first, second and third dielectric layers comprises nitrogen.

8. The capacitor of claim 7, wherein the first and second dielectric layers have thicknesses in a range between 1 nm and 10 nm; and wherein the third dielectric layer has a thickness in a range between 0.1 nm and 2 nm.

9. An integrated circuit capacitor comprising:
a lower electrode and an upper electrode; and
at least one first dielectric layer and at least one second dielectric layer interposed between the lower electrode and the upper electrode, the first dielectric layer extending directly on the lower electrode and the second dielectric layer extending directly on the first dielectric layer opposite to the lower electrode, wherein the second dielectric layer is a non-crystalline layer, has a higher crystallization temperature than that of the first dielectric layer and is thinner that the first dielectric layer; and wherein the first dielectric layer is a zirconium-containing oxide layer and the second dielectric layer is an Al2O3 layer or an AlN layer.

10. An integrated circuit capacitor comprising:
a lower electrode and an upper electrode; and
at least one first dielectric layer and at least one second dielectric layer interposed between the lower electrode and the upper electrode, the first dielectric layer extending directly on the lower electrode and the second dielectric layer extending directly on the first dielectric layer opposite to the lower electrode, wherein the second dielectric layer is an amorphous layer, has a higher crystallization temperature than that of the first dielectric layer and is thinner that the first dielectric layer; and wherein the first dielectric layer is a zirconium-containing oxide layer and the second dielectric layer is an Al2O3 layer or an AlN layer.

11. An integrated circuit capacitor comprising:
a lower electrode and an upper electrode; and
at least one first dielectric layer and at least one second dielectric layer interposed between the lower electrode and the upper electrode, the first dielectric layer extending directly on the lower electrode and the second dielectric layer extending directly on the first dielectric layer opposite to the lower electrode, wherein the second dielectric layer has a higher crystallization temperature than that of the first dielectric layer and is thinner that the first dielectric layer; and wherein the first dielectric layer is a nitrogen-doped zirconium-containing oxide layer and the second dielectric layer is an Al2O3 layer or an AlN layer.

12. An integrated circuit capacitor, comprising:
lower and upper capacitor electrodes; and
a capacitor dielectric layer extending between said lower and upper capacitor electrodes, said capacitor dielectric layer comprising a composite of a first dielectric layer extending directly on the lower electrode, a second dielectric layer extending on the upper electrode and a third dielectric layer extending directly on the first dielectric layer, said first and second dielectric layers comprising respective oxides selected from a group consisting of hafnium oxide, zirconium oxide and lanthanum oxide and said third dielectric layer having a higher crystallization temperature relative to the first and second dielectric layers, a thickness less than a thickness of the first dielectric layer and a thickness of the second dielectric layer, and comprising a material selected from a group consisting of aluminum oxide, aluminum nitride and silicon nitride;
wherein at least one of the first and second dielectric layers is doped with nitrogen.

13. An integrated circuit capacitor, comprising:
lower and upper capacitor electrodes;
a capacitor dielectric layer extending between said lower and upper capacitor electrodes, said capacitor dielectric layer comprising a composite of a first dielectric layer extending directly on the lower electrode, a second dielectric layer extending on the upper electrode and a third dielectric layer extending directly on the first dielectric layer, said first and second dielectric layers comprising respective oxides selected from a group consisting of hafnium oxide, zirconium oxide and lanthanum oxide and said third dielectric layer having a higher crystallization temperature relative to the first and second dielectric layers, a thickness less than a thickness of the first dielectric layer and a thickness of the second dielectric layer, and comprising a material selected from a group consisting of aluminum oxide, aluminum nitride and silicon nitride; and
a capping layer on said upper capacitor electrode, said capping layer comprising a material selected from a group consisting of silicon germanium, polysilicon and tungsten.

14. An integrated circuit capacitor, comprising:
lower and upper capacitor electrodes; and
a capacitor dielectric layer extending between said lower and upper capacitor electrodes, said capacitor dielectric layer comprising a composite of a first dielectric layer extending directly on the lower electrode, a second dielectric layer extending on the upper electrode and a third dielectric layer extending directly on the first dielectric layer, said first and second dielectric layers comprising respective oxides selected from a group consisting of hafnium oxide, zirconium oxide and lanthanum oxide and said third dielectric layer having a higher crystallization temperature relative to the first and second dielectric layers, a thickness less than a thickness of the first dielectric layer and a thickness of the second dielectric layer, and comprising a material selected from a group consisting of aluminum oxide, aluminum nitride and silicon nitride;
wherein the third dielectric layer is a non-crystalline layer.

15. The capacitor of claim 14, wherein the first and second dielectric layers have thicknesses in a range between 1 nm and 10 nm; and wherein the third dielectric layer has a thickness in a range between 0.1 nm and 2 nm.

* * * * *